United States Patent
Anselm et al.

(10) Patent No.: US 6,180,429 B1
(45) Date of Patent: Jan. 30, 2001

(54) PROCESS FOR SELECTIVE AREA GROWTH OF III–V SEMICONDUCTORS

(75) Inventors: Klaus Alexander Anselm, New Providence; James Nelson Baillargeon, Springfield; Alfred Yi Cho, Summit, all of NJ (US); Wen-Yen Hwang, Hauppauge, NY (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/198,111

(22) Filed: Nov. 23, 1998

(51) Int. Cl.[7] .................................................. H01L 21/00
(52) U.S. Cl. .................................. 438/22; 438/39; 438/40
(58) Field of Search ............................... 438/22, 39, 40, 438/44, 46, 23, 41, 47

(56) References Cited

U.S. PATENT DOCUMENTS

| | | | |
|---|---|---|---|
| 5,251,225 * | 10/1993 | Eglash et al. | 438/22 |
| 5,506,170 * | 4/1996 | Yodoshi et al. | 438/47 |
| 5,789,275 * | 8/1998 | Lee et al. | 438/40 |
| 5,863,811 * | 1/1999 | Kawai et al. | 438/47 |

* cited by examiner

Primary Examiner—David Nelms
Assistant Examiner—Dung A. Le
(74) Attorney, Agent, or Firm—Peter V. D. Wilde

(57) ABSTRACT

The specification describes a lift-off technique useful in the manufacture of III–V semiconductor devices such as MQW lasers. The lift-off step is improved by a spacer layer of III–V semiconductor that can be non-selectively etched to form a mesa stripe, and selectively etched for the lift-off step. The spacer layer allows the etch mask to be dimensionally adjusted to reduce or eliminate overhang of the mesa, and prevent adverse shadowing effects. MBE is effective for both growing the multilayer stack and regrowing the blocking layer. A self-aligned mask on the multilayer stack can be produced by removing the overhang, and facilitating lift-off by producing an undercut in the III–V spacer layer using selective etching.

13 Claims, 3 Drawing Sheets

PROCESS FOR SELECTIVE AREA GROWTH OF III-V SEMICONDUCTORS

FIELD OF THE INVENTION

This invention relates to methods for the selective deposition of III–V semiconductors for use in processing electronic and optoelectronic devices.

BACKGROUND OF THE INVENTION

Processing of III–V semiconductors includes vital steps for depositing III–V materials on selected areas of the device substrate. Additive processes are well known and usually take the form of one of two general approaches. Chemically active gaseous species can be made to deposit preferentially on a semiconductor surface, and not deposit on a masking layer. Somewhat more versatile, because they are relatively material independent, are lift-off techniques, where material is blanket deposited on the intended region of the substrate as well as on the mask, but the mask is raised sufficiently that the deposited layer forms with a disconnect at the step between the portion on the substrate and the portion on the mask. When the mask is removed the material deposited on the mask easily lifts off.

III–V heterostructure devices typically have many semiconductor layers. For example, a multiquantum well (MQW) laser has a minimum of six layers, i.e. active multiquantum well layers, two waveguide layers, two cladding layers, and a contact layer. For process simplicity, reduced contamination and lower cost, the multiple layers are typically deposited in a single sequential operation. This produces a relatively large multilayer stack. The active device area is defined by etching around a portion of the multilayer stack to produce a mesa stripe. Passivating the resulting mesa, where sensitive junction regions are exposed at the surface, usually requires deposition of a passivating material. Mesas in typical heterostructure transistor manufacture can be passivated using insulating materials, such as $SiO_2$, which permits relatively straightforward deposition approaches. However, in heterostructure lasers, the device performance is determined by the optical as well as electrical properties of the sidewall interface and regrown layers, and thus requires a compatible optical material to fill the region around the multilayer mesa. Accordingly, it is customary to grow a III–V epitaxial semiconductor blocking layer on the substrate and the sidewalls of the mesa.

Selective area growth processes of both categories mentioned above are candidates for the purpose just described. Preferential deposition techniques using metal-organic chemical vapor deposition (MOCVD) or chemical beam epitaxy (CBE) have been used. Under the proper growth conditions, precursors of the blocking layer material can be made to react with the semiconductor substrate and the semiconductor sidewall to grow epitaxial material on the mesa sidewall, while not reacting with the mask material (typically silicon dioxide or silicon nitride).

A drawback to these chemical processes is that they involve hazardous gases. They have other limitations as well. In the case of CBE, the typical precursor materials contain organic constituents and result in unwanted carbon doping of the semiconductor. In MOCVD, the growth temperatures are high, resulting in mass transport of the layers, and undesired diffusion in the multilayer stack. Moreover, the relatively poor directionality of the depositing material requires a large mask overhang to obtain effective lift-off, leading to dimensional control problems.

We propose using all solid-source molecular beam epitaxy (MBE) which does not use toxic gases, and does not have the same control and diffusion problems as the chemical processes just described. However, known MBE approaches that are adapted for this application have problems also. Due to the near unity sticking of group III constituents, material deposits rapidly on the mask as well as on the substrate and mesa sidewalls. Even with a relatively thick mask, material deposited on the mask grows over the mask edge and connects to the material growing from the sidewall. When this material, which is not of epitaxial quality, mixes with epitaxial material growing from the substrate, the crystal quality of the overall layer deteriorates. Moreover, when these regions grow together, lift-off is no longer effective.

It would appear that a solution to these problems would be to use a large overhang on the lift-off mask. Techniques for producing overhangs are available, and are reasonably straightforward to implement. However, a large overhang also has a large shadow. The overhang interferes with pre-cleaning the sidewall prior to deposition. Also, a large overhang excessively masks the sidewalls during deposition.

SUMMARY OF THE INVENTION

We propose a modified masking layer that addresses the concerns just outlined. The modified mask uses a III–V semiconductor spacer layer under the primary mask layer. The modified mask is used in an etch step, which is non-selective among the semiconductor layers, to define the mesa structure, and in a selective etch step for lift-off patterning after epitaxial regrowth of the blocking layer. The modified mask enables use of MBE for the regrowth step and thus allows the entire epitaxial growth process to be done using MBE.

DETAILED DESCRIPTION

Figure 1:
FIG. 1 is a schematic diagram of a multilayer stack for a MQW laser prior to defining the active device areas.

With reference to FIG. 1, a multilayer stack 11 is shown prior to etching to define the device mesas. The multilayer stack is shown with mask layer 12 and the spacer layer of the invention 13. The multilayer stack is representative of a variety of multilayer structures that are used in III–V device technology. The particular example described here is a MQW laser structure and comprises the following:

a. Substrate 14 is an InP wafer which is shown cut away to illustrate that the section shown is but a portion of a larger substrate which may contain many devices. The substrate is typically doped n-type. In some laser devices the substrate is covered with an optical grating.

b. First cladding layer 15 of n-type InP with a thickness of 1000–10000 Å with the preferable value depending on desired characteristics, and an impurity concentration of $5 \times 10^{17} - 5 \times 10^{18}/cm^3$.

c. First SCH (separate confinement heterostructure) layer 16 which is preferably undoped InGaAsP with a thickness in the range 500–1500 Å, but the SCH layer may also be doped.

d. MQW active region 17 comprising undoped alternate layers of InGaAsP and InAsP or InGaAs with a combined thickness in the range 300–1500 Å.

e. Second SCH layer 18 which is preferably undoped InGaAsP with a thickness in the range 500–1500 Å, but the SCH may also be doped in some cases.

f. Second cladding layer 19 of p-type InP with a thickness of 4000–8000 Å and an impurity concentration of $5 \times 10^{17}$–$5 \times 10^{18}/cm^3$.

g. Spacer layer 13 which is preferably GaAs or InGaAs, which may be doped or undoped with a thickness in the range 1000–10000 Å, preferably 3000–6000 Å.

h. Mask layer 12 of $SiO_2$ or $Si_3N_4$, with a thickness of 1000–3000 Å.

The layers in the multilayer stack are grown by any suitable technique, e.g., MOCVD or CBE, but are preferably grown using MBE. These techniques are well known to those skilled in the art and do not require detailed exposition. The multilayer structure is preferably produced by sequential deposition in an MBE apparatus without breaking vacuum. The top $SiO_2$ or $Si_3N_4$ mask layer 12 may be deposited by CVD or plasma enhanced CVD.

Figure 2:
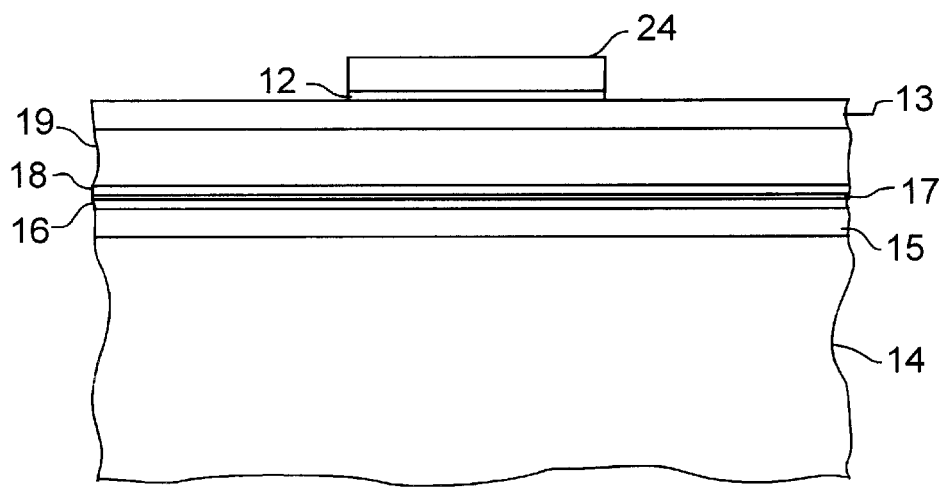
FIGS. 2–7 are schematic drawings representing processing steps used to define the active device layers using the spacer layer in accordance with the invention.

After completion of the multilayer stack the mask and the spacer layer are defined using conventional lithography. Typically photolithography will be used, but electron beam or x-ray lithography can be used as well. The resulting bi-level mask is shown in FIG. 2. The lithographic mask is shown at 24.

Figure 3:
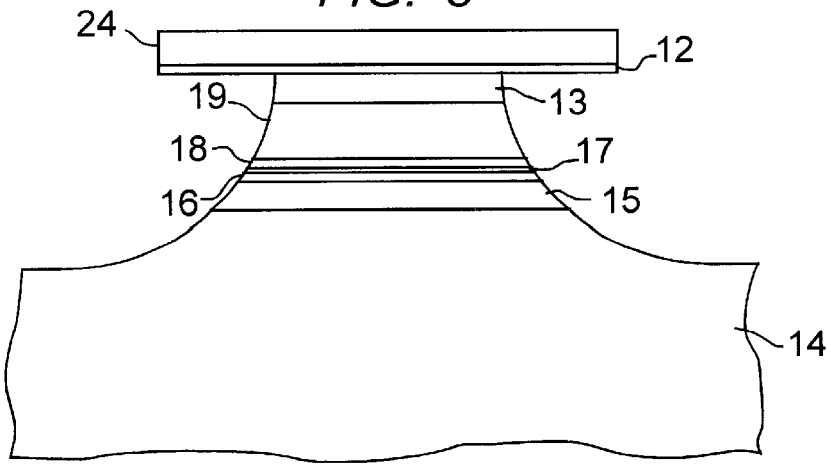

The multilayer stack is then etched using a non-selective, isotropic etch such as Br:Methanol or $HBr:HNO_3$. The etch proceeds through the entire stack and into a portion of the substrate 14. The stack height in the example given is approximately 1.5 $\mu$m and the etch depth is approximately 2.0 $\mu$m. The resulting structure appears as in FIG. 3. The overhang at this point may be acceptable, or may be excessive. To reduce the overhang or to produce a more controlled overhang, a brief HF etch can be used to remove the overhang, followed by a brief undercut etch of the mesa sidewalls and the spacer layer. This etch typically undercuts 0.05 to 0.2 $\mu$m, i.e. the overhang dimension desired.

The resist can remain in place for the deep mesa etch. After defining the mesa the resist is removed and the structure is cleaned using standard procedures.

Figure 4:
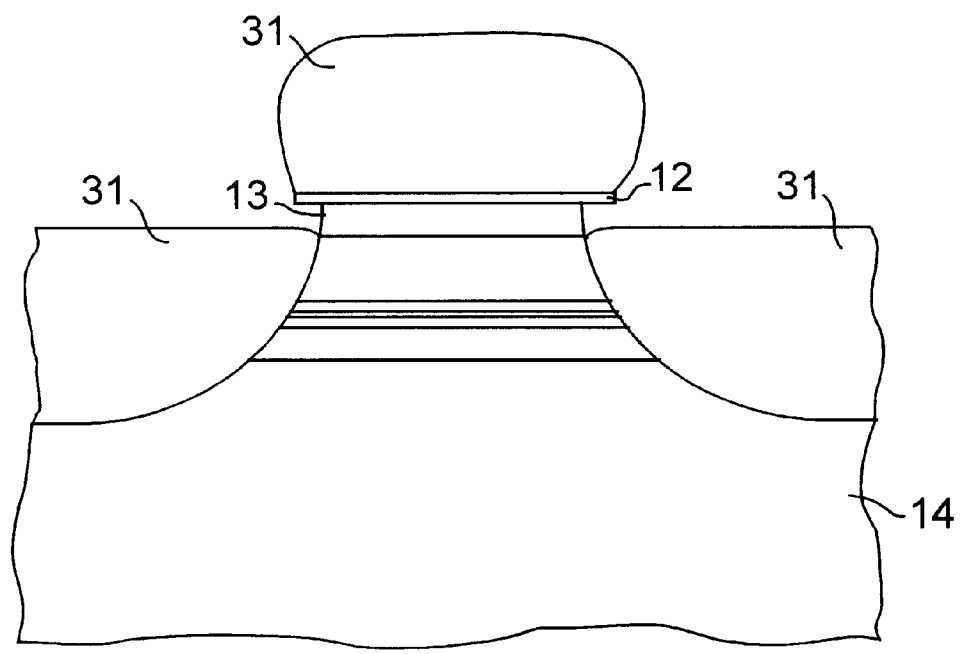

The blocking layer 31 is then grown on the exposed substrate, the exposed sidewalls and on the masking layer 12, as shown in FIG. 4. The blocking layer comprises InP and is preferably a multilayer of p-type and n-type InP, grown by MBE for reasons described above. A suitable sequence is 6000 Å p-type InP, 3000 Å n-type, 3000 Å p-type and 3000 Å n-type. Appropriate carrier concentration in each case is approximately $1 \times 10^8/cm^3$. For cases in which speed is important, a semi-insulating layer should be used in the current blocking layer. In this example, the total blocking layer thickness is approximately the same as the depth of the stack, i.e. 1.5 $\mu$m.

Figure 5:
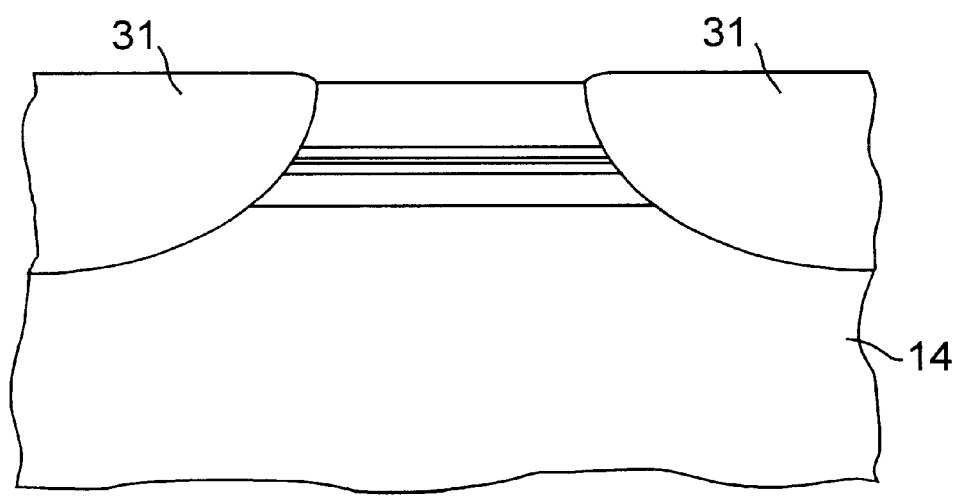

At this point the mask layer 12 and the spacer layer 13 are removed. HF may be used to remove a $SiO_2$ mask. Citric acid:peroxide can be used to remove the spacer layer and is selective, i.e. it removes the spacer layer without attacking the device layers. This etch step lifts off unwanted InP and thus provides the selective area growth feature. The structure after removal of the mask layers and lift-off of unwanted growth material is shown in FIG. 5.

Figure 6:
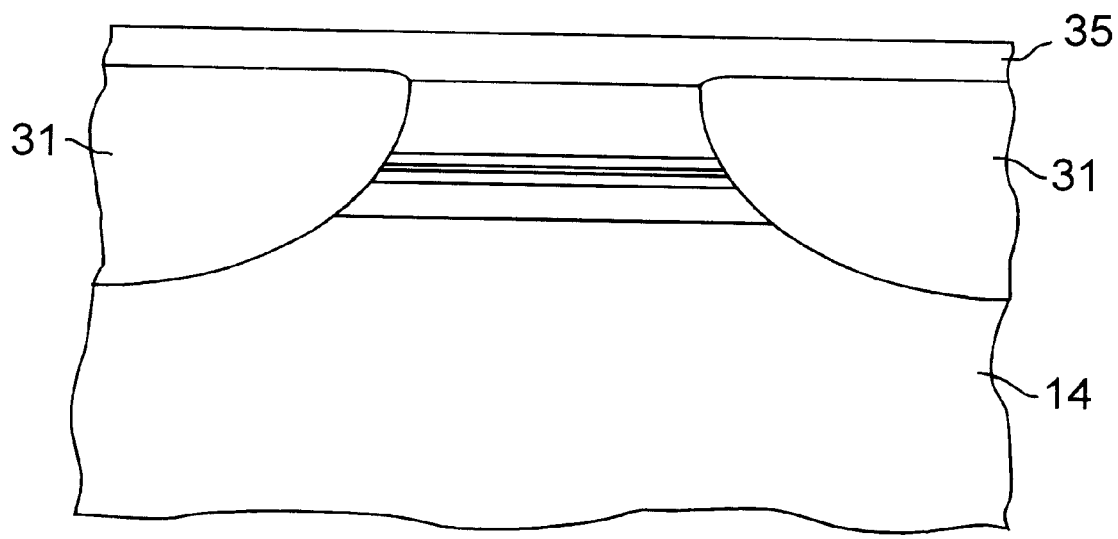
Figure 7:
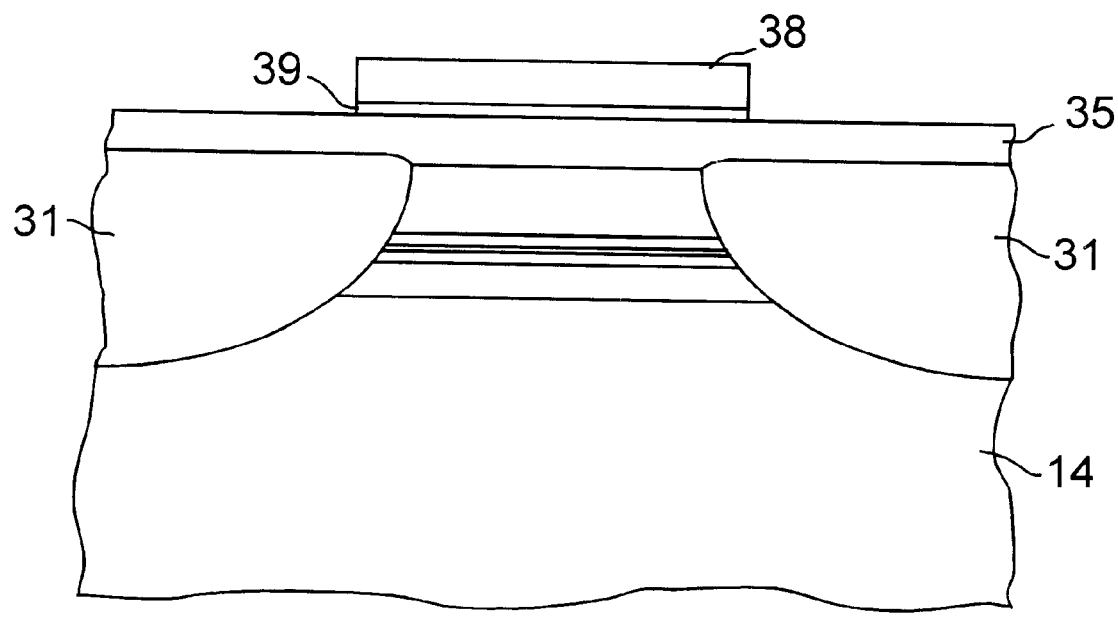

A second regrowth of InP is then performed to cover the structure as shown at 35 in FIG. 6. This layer is preferably p-type InP. With reference to FIG. 7, a metal contact 38, is deposited to form a standard p-type ohmic contact.

The spacer layer is an important feature of the invention. The spacer layer is a relatively thick, i.e. >0.1 $\mu$m, III–V semiconductor layer which can be etched both selectively and non-selectively with respect to the multilayer stack. The spacer layer should not contaminate or damage the underlying multilayers. The material of the spacer layer should have an incongruent vaporization temperature that is higher than that of the substrate and the mesa, on which selective regrowth occurs. The incongruent vaporization temperature is defined here as the temperature at which the column V atoms, As and P, desorb from the surface at a rate faster than the column III atoms, In, Ga and Al. The spacer layer should be thick enough that the material growing from the sidewall and the material deposition on the mask do not come in contact.

Materials with an appropriate incongruent vaporization temperature, and suitable for use as the spacer layer, include GaAs, InGaAs, AlGaAs and AlGaInAs. Spacer layers of these materials can withstand temperatures used for cleaning, etc. during processing of the wafer. For example, it is important in these processes to remove surface oxides and other contaminants prior to the regrowth step. For some materials, such as GaAs, the surface oxides desorb near 590° C., which is below the incongruent vaporization temperature of GaAs (640° C.). However, the incongruent vaporization temperature for InP is only 360° C., well below the temperatures, e.g. 520° C., used for thermal cleaning. The temperature necessary to thermally remove oxides from InGaAsP will be somewhat intermediate to InP and GaAs: Compositions nearer InP will have a similar incongruent vaporization point and those closer to GaAs will be similar to GaAs. For planar substrates, this difficulty is avoided by supplying a group V (As or P) overpressure to prevent the semiconductor from decomposing. In cases where the epitaxial growth is done in high vacuum utilizing an oxide or nitride mask, a portion of the semiconductor will be shadowed from the group V overpressure, resulting in the existing material under the mask preferentially losing the group V constituent and forming In and Ga droplets. Other techniques, such as hydrogen plasma cleaning, have been used to clean the surface without resort to elevated temperatures. However, if the mask has an overhang, part of the surface will be shielded from the H plasma and will not be cleaned effectively.

This shadowing effect also causes problems during growth. Since the temperatures required to grow InP and InGaAsP (typically 460–500° C.) exceed the incongruent sublimation temperature by 100° C. or more, continuous decomposition of the semiconductor material will occur in the region shadowed by the mask.

The spacer layer of the invention allows considerable control over the final regrowth profile due to the ability to independently optimize the thickness of the pacer layer (for lift-off) and the degree of mask overhang (for avoiding the growth complications outlined above). For example, in high vacuum growth techniques, shadowing due to the mask and the etched mesa can cause the growth to be reduced or pinched-off near the mesa, thus preventing regrowth on part of the mesa sidewalls. The spacer layer raises the mask further above the device layers, allowing more complete sidewall coverage. The use of the spacer layer should result in a smoother final surface with no vertical mesa sidewalls. This allows more effective patterning etc. in subsequent process steps. Another advantage of the spacer layer is the elimination of contamination or damage of the multilayer stack due to the mask, since the spacer provides a buffer to that damage.

The primary etch mask, i.e. the mask layer on top of the spacer layer, can be any suitable material but as mentioned earlier is silicon dioxide or silicon nitride. It can also be silicon oxynitride. Silicon nitride often forms with a composition off stoichiometry so is frequently expressed as $SiN_x$. The mask layer of the invention serves both as an etch mask and a lift-off mask, and may be defined in the following claims as a lift-off mask which will convey to those skilled in the art its dual function in the context of the processes described here.

In the foregoing examples, where reference is made to p-type and n-type material it will be understood by those skilled in the art that complementary structures can be made using the technique of the invention.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of a III–V heterostructure device comprising the steps of:
   a. depositing on a III–V semiconductor substrate a plurality of semiconductor layers, said plurality including a bottom layer, at least one intermediate layer, and a top layer, the top layer having a first III–V composition,
   b. forming a lift-off mask layer on said top layer, said lift-off mask layer comprising
      (i.) an etch mask layer comprising a material selected from the group consisting of silicon dioxide, silicon nitride, and silicon oxynitride,
      (ii.) a spacer layer having a thickness of at least 0.1 micron and comprising a III–V semiconductor with a second III–V composition different than the said first III–V composition and having an incongruent vaporization temperature that is higher than that of said first III–V composition,
   c. lithographically masking said etch mask layer,
   d. etching said etch mask layer to form an etch mask,
   e. etching in a single step the spacer layer, and the plurality of III–V semiconductor layers, to form a spacer and a mesa of III–V semiconductor layers,
   f. selectively forming by regrowth a III–V semiconductor blocking layer on said mesa, leaving said spacer free of blocking layer, and
   g. removing said spacer and said etch mask.

2. The method of claim 1 wherein the III–V semiconductor substrate is InP.

3. The method of claim 2 wherein the plurality of III–V semiconductor layers comprises a first cladding layer, a first waveguide layer, multiquantum well layers, a second waveguide layer, and a second cladding layer.

4. A method for the manufacture of a III–V heterostructure device comprising the steps of:
   a. depositing on a III–V semiconductor substrate a plurality of III–V semiconductor layers, said plurality including a bottom layer, at least one intermediate layer, and a top layer,
   b. forming a lift-off mask layer on said top layer, said lift-off mask layer comprising an etch mask layer and a spacer layer, said etch mask layer comprising a material selected from the group consisting of silicon dioxide, silicon nitride, and silicon oxynitride, and said spacer layer is selected from the group consisting of GaAs, InGaAs, AlGaAs, and AlGaInAs,
   c. lithographically masking said etch mask layer,
   d. etching said etch mask layer to form an etch mask,
   e. etching in a single step the spacer layer, and the plurality of III–V semiconductor layers, to form a spacer and a mesa of III–V semiconductor layers,
   f. regrowing a III–V semiconductor layer or layers on said mesa, and
   g. removing said spacer and said etch mask.

5. The method of claim 1 wherein the III–V semiconductor layer in step f. is regrown by MBE.

6. The method of claim 5 wherein the plurality of III–V semiconductor layers are deposited by MBE.

7. The method of claim 1 wherein step g. comprises etching said spacer layer with a selective etchant that etches said spacer layer without substantially etching said top layer.

8. The method of claim 1 wherein step e. is conducted using an isotropic etchant that produces an overhang between said etch mask and said mesa.

9. The method of claim 8 further including the step of etching away said overhang and the additional step, after etching away said overhang, of isotropically etching said mesa to produce a second overhang.

10. The method of claim 8 further including the step of etching away said overhang and the additional step, after etching away said overhang, of selectively etching said spacer layer to produce an undercut between said top layer and said etch mask.

11. A method for the manufacture of a III–V heterostructure device comprising the steps of:
    a. depositing on an InP substrate:
       i. a first cladding layer of n-type InP with a thickness of 1000–10000 Å and an impurity concentration of $5 \times 10^{17}$–$5 \times 10^{18}$/cm$^3$,
       ii. a first SCH layer of undoped InGaAsP with a thickness in the range 500–1500 Å,
       iii. a MQW active region comprising undoped alternate layers of InGaAsP and InAsP, said active region having a thickness in the range 300–1500 Å,
       iv. a second SCH layer of undoped InGaAsP with a thickness in the range 500–1500 Å,
       v. a second cladding layer of p-type InP with a thickness of 4000–8000 Å and an impurity concentration of $5 \times 10^{17}$–$5 \times 10^{18}$/cm$^3$,
       vi. a spacer layer of a III–V semiconductor with a thickness in the range 1000–10000 Å,
       vii. a mask layer with a thickness of 1000–3000 Å selected from the group consisting of silicon dioxide, silicon nitride and silicon oxynitride,
    b. lithographically patterning said mask layer to form an etch mask,
    c. etching in a single step layers i.–vi. and a portion of said InP substrate to form a spacer and a mesa of III–V semiconductor layers,
    f. regrowing by MBE an InP semiconductor layer on said mesa, and
    g. removing said spacer and said etch mask.

12. The method of claim 11 wherein the spacer layer is selected from the group consisting of GaAs, InGaAs, AlGaAs, and AlInGaAs.

13. The method of claim 11 wherein the deposition of step a. is performed using MBE.

* * * * *